(12) United States Patent
Panov

(10) Patent No.: US 8,581,627 B2
(45) Date of Patent: Nov. 12, 2013

(54) HIGH-SPEED LEVEL SHIFTER BETWEEN LOW-SIDE LOGIC AND HIGH-SIDE LOGIC

(75) Inventor: Georgi Panov, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 154 days.

(21) Appl. No.: 13/222,215

(22) Filed: Aug. 31, 2011

(65) Prior Publication Data

US 2013/0049808 A1    Feb. 28, 2013

(51) Int. Cl.
*H03K 19/0175* (2006.01)
(52) U.S. Cl.
USPC .............................................. 326/80; 326/93
(58) Field of Classification Search
None
See application file for complete search history.

(56) References Cited

U.S. PATENT DOCUMENTS

| | | | |
|---|---|---|---|
| 4,996,443 A | 2/1991 | Tateno | |
| 5,627,489 A * | 5/1997 | Jochum | 327/333 |
| 6,201,429 B1 | 3/2001 | Rosenthal | |
| 6,236,244 B1 | 5/2001 | Depetro et al. | |
| 6,727,742 B2 | 4/2004 | Mariani et al. | |
| 7,629,830 B1 | 12/2009 | Rubin | |
| 7,733,153 B2 | 6/2010 | Flaibani et al. | |
| 7,994,819 B2 | 8/2011 | Al-Shyoukh et al. | |
| 2010/0117682 A1* | 5/2010 | Al-Shyoukh et al. | 326/80 |

* cited by examiner

*Primary Examiner* — Crystal L Hammond
(74) *Attorney, Agent, or Firm* — Eschweller & Associates, LLC

(57) ABSTRACT

One embodiment of the present invention relates to a level shifter circuit having switchable current mirrors that can be selectively activated and deactivated in a complementary manner to translate differential input signals between logic sides (e.g., to translate a differential input signal received at a low-side to a high-side). A latch is connected to outputs of the switchable current mirrors. The latch is configured to receive a translated output signal from an activated current mirror and drive the other output signal to a complementary value. The latch is also configured to provide the translated output signal to a switching element that deactivates (e.g., turns off) the activated switchable current mirror. Storage of the output signals allows for the current mirrors to remain deactivated until a new input signal is provided to the level shifter circuit, thereby allowing for a reduction in the static power consumption of the level shifter.

22 Claims, 6 Drawing Sheets

US 8,581,627 B2

HIGH-SPEED LEVEL SHIFTER BETWEEN LOW-SIDE LOGIC AND HIGH-SIDE LOGIC

BACKGROUND

Drain extended MOSFET (DEMOS) devices are designed to accommodate relatively high supply voltages, which allow circuits to be built in standard digital CMOS technologic that can be directly connected to a battery. Such circuits are capable of providing current to a load by way of a high-side switch connected to the battery. The high-side switch is driven by high-side digital logic, having a high-side high level (e.g., a high-side supply voltage) equal to the battery voltage and high-side low level (e.g., a high-side "ground" voltage) equal to the battery voltage minus the digital core supply voltage.

To transmit signals between a low-side digital logic of an electric circuit (e.g., the digital core) having a first voltage potential and a high-side digital logic of an electric circuit having a second voltage potential greater than the first voltage potential (and vice versa) level shifter circuits are used. For example, level shifter circuits are frequently used in -high-side driver circuits (HSD) to provide a sufficient gate-to-source voltage to drive a high-side switch.

FIG. 1 illustrates a block diagram of a high voltage gate driver circuit 100 having a level shifter circuit 102 configured to translate differential signals from a low-side ($V_{in1}$ and $V_{in2}$) to a high-side ($V_{out1}$, $V_{out2}$). The high voltage gate driver circuit 100 comprises a high-side driver 104 connected to the gate of a high-side switch 108 (e.g., a power field effect transistor having a source connected to a battery voltage and a drain connected to a node) and a low-side driver 106 connected to the gate of a low-side switch 110 (e.g., a power field effect transistor having a source connected to the node and a ground terminal).

If the high-side switch 108 is a PDEMOS device, a voltage smaller than the potential at the source minus the threshold voltage is needed to turn on the device (e.g., in contrast to the low-side switch 110, in which source is connected to ground, so that a voltage larger than the threshold voltage turns on the device). Therefore, level shifter circuit 102 is configured to translate low-side signals ($V_{in1}$, $V_{in2}$) to high-side signals ($V_{out1}$, $V_{out2}$), having a sufficient gate-to-source voltage to drive a high-side switch 110.

BRIEF DESCRIPTION OF THE DRAWINGS

FIG. 4b illustrates signal diagrams corresponding to the level shifter circuit of FIG. 4a.

DETAILED DESCRIPTION

Figure 1:
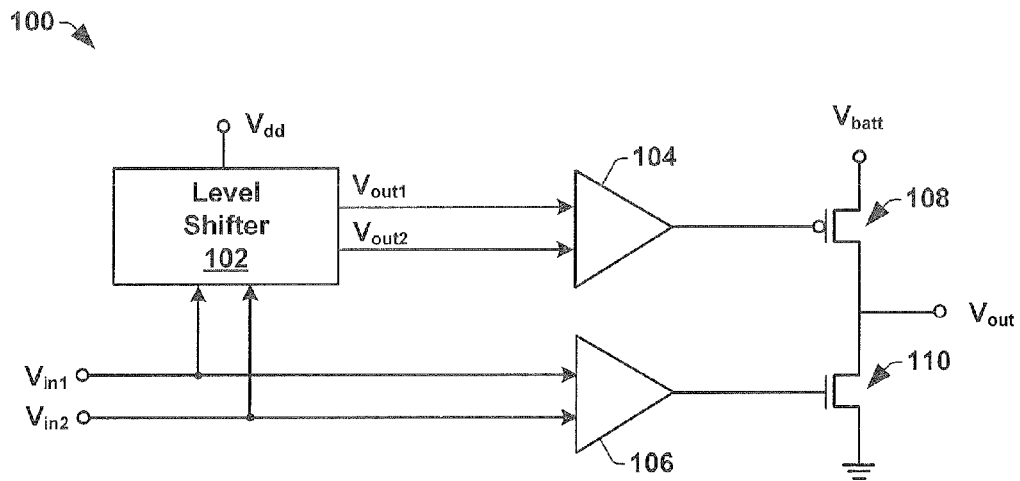
FIG. 1 illustrates a block diagram of a high voltage gate driver circuit having a level shifter circuit configured to translate differential signals from a low-side to a high-side.

The present invention will now be described with reference to the attached drawing figures, wherein like reference numerals are used to refer to like elements throughout, and wherein the illustrated structures and devices are not necessarily drawn to scale.

Some aspects of the present disclosure provide for a level shifter circuit having switchable current mirrors that can be selectively activated (i.e., turns on) and deactivated (i.e., turned off) in a complementary manner to translate differential input signals of a first logic side to complementary differential output signals of a second logic side (e.g., to translate a differential input signal received at a high side or a low side to a low side or a high side). A latch is connected between the differential output signals generated by the switchable current mirrors. The latch is configured to receive a translated differential output signal from an activated current mirror and drive the other differential output signal to a complementary value. The latch is also configured to provide the translated differential output signal to one or more switching elements that deactivate (e.g., turns off) the activated switchable current mirror. The latch stores the output signals so that the current mirrors to remain deactivated until a new input signal is provided to the level shifter circuit, thereby allowing for a reduction in the static power consumption of the level shifter.

Figure 2:
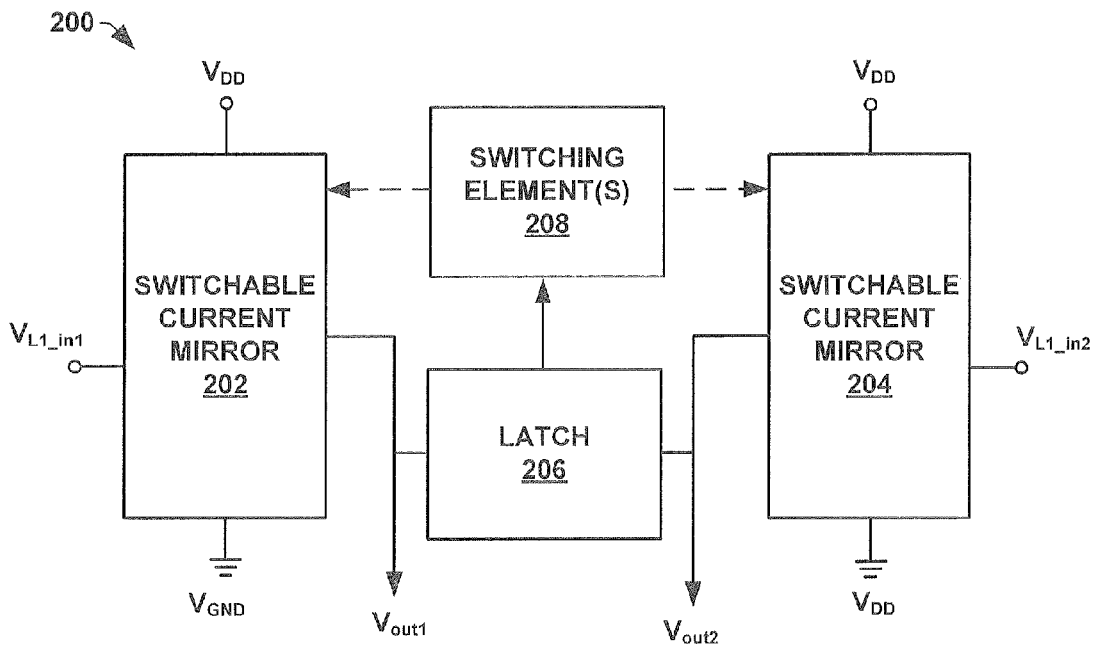
FIG. 2 illustrates a block diagram of a first embodiment of a level shifter circuit configured to translate signals from one logic side to another.

FIG. 2 illustrates a block diagram of a first embodiment of a level shifter circuit 200 configured to translate differential input signals, $V_{L1\_in1}$ and $V_{L1\_in2}$ from one logic side to another.

As illustrated in FIG. 2, the level shifter circuit 200 comprises a first switchable current mirror circuit 202 configured to receive a first input signal $V_{L1\_in1}$ of a first logic side (e.g., of a low-side) and a second switchable current mirror circuit 204 configured to receive a second input signal $V_{L1\_in2}$ of the first logic side, which is complementary to the first input signal $V_{L1\_in1}$ (e.g., $V_{L1\_in1}$ is high when $V_{L1\_in2}$ is low, and vice versa). The switchable current mirror circuits are configured to be selectively activated (i.e., turns on) and deactivated (i.e., turned off) in a complementary manner, such that one of the first or second switchable current mirror is activated at a time to (i.e., one current mirror circuit activated when the other is deactivated) to translate the differential input signals $V_{in1}$ and $V_{in2}$ to complementary differential output signals $V_{out1}$ and $V_{out2}$ of a second logic side (e.g., of a high-side).

A latch 206 is connected between the differential outputs of the current mirrors $V_{out1}$ and $V_{out2}$. The latch 206 is configured to receive and store the output signals generated by the switchable current mirror circuits. The latch 206 is also configured to provide one or more of the translated output signals to one or more switching elements 208. Upon receiving the one or more of translated output signals from the latch 206, the one or more switching elements 208 deactivate (e.g., turns off) an activated switchable current mirror. The current mirrors remain deactivated until a new input signal is provided to the level shifter circuit, thereby allowing for a reduction in the static power consumption of the level shifter circuit 200.

When a new input signal is received, a switchable current mirror is activated to generate a new output signal translated from the new input signal.

In one embodiment, one of the two switchable current mirror circuits is activated (i.e., turned on) to translate an input signal of the first logic side (e.g., a low-side) to an output signal of the second logic side (e.g., a high-side), while the other switchable current mirror circuit remains deactivated. In such an embodiment, the latch 206 receives a translated differential output signal from the activated switchable current mirror and drives the other differential output signal to a complementary value. Upon receiving one or more differential output signal from the latch 206, the switching element 208 deactivates (e.g., turns off) the activated switchable current mirror that generated the translated differential output signal.

For example, the first switchable current mirror 202 may be configured to receive a first low-side input signal $V_{in1}$ comprising a "1" and the second current mirror 204 may be configured to receive a second low-side input signal $V_{in2}$ comprising a "0". The switchable first current mirror 202 is activated to translate the first low-side input signal "1" to generate a first output signal $V_{batt}$ (the supply of the high-side logic) while the second switchable current mirror 204 remains deactivated. The latch 206 stores the translated output signal $V_{batt}$ and drives the second output signal to a complementary value $v_{low}$ (the "ground" of the high-side logic). The latch 206 also provides the output signals to the switching element 208, which based upon the output signals, switches off the first switchable current mirror 202.

Figure 3:
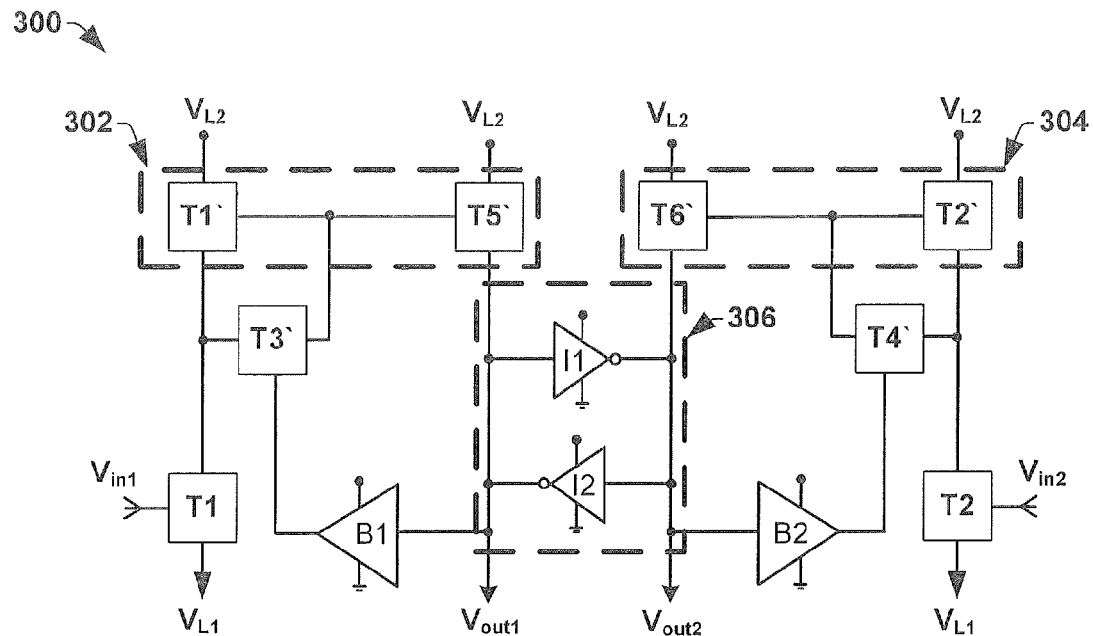
FIG. 3 illustrates a block diagram of a more detailed embodiment of a level shifter circuit configured to translate signals from one logic side to another.

FIG. 3 illustrates a more detailed block diagram of a level shifter circuit 300 configured to translate voltages from one logic side to another (e.g., from a first voltage potential domain to a second voltage potential domain). It will be appreciated that in FIG. 3, transistors are denoted as a being of a first channel doping type (having no prime symbol) or a second channel doping type (having a prime symbol, '). For example, transistors T1 and T2 have a channel with a first doping type (e.g., n-type), while transistors T1', T2', T3', T4', T5', and T6' have a channel with a second doping type (e.g., p-type).

The level shifter circuit 300 comprises first and second transistors, T1 and T2, which are configured to receive a differential input signals $V_{in1}$ and $V_{in2}$ of the first logic side. The first transistor T1 has a gate connected to the first input signal $V_{in1}$, a source coupled to a first logic side voltage $V_{L1}$ (e.g., low-side ground, high side supply), and a drain coupled to a first current mirror 302. The second transistor T2 has a gate connected to the second input signal $V_{in2}$ of the first logic side, a source coupled to the first logic side voltage $V_{L1}$, and a drain coupled to a second current mirror 304.

The first current mirror 302 comprises two transistors T1' and T5' that share a common gate voltage. The drain of transistor T1' is coupled to the source of the first transistor T1, the drain of transistor T5' is coupled to a first differential output terminal, and the source of transistors T1' and T5' are coupled to a second logic side voltage $V_{L2}$. The second current mirror 304 comprises two transistors T2' and T6' that share a common gate voltage. The drain of transistor T2' is coupled to the source of the second transistor T2, the drain of transistor T6' is coupled to a second differential output terminal, and the source of transistors T2' and T6' are coupled to the second logic side voltage $V_{L2}$. In one embodiment, the transistors of the current mirrors have unequal gate widths to generate a specified output current. For example, transistor T5' may be configured to have a larger gate width than transistor T1', such that when a current is provided through transistor T1', the current through transistor T5' is larger (since it has a wider gate width).

The first and second current mirrors, 302 and 304, may be selectively activated and deactivated by control transistors T3' and T4', respectively. In one embodiment, control transistors T3' and T4' are configured to concurrently turn on one current mirror and to turn off the other current mirror (e.g., to turn on the first current mirror 302 and to turn off the second current mirror 304). In one embodiment, the gate of control transistor T3' is connected to a first differential output signal $V_{out1}$ and the gate of control transistor T4' is connected to a second differential output signal $V_{out2}$. Since differential output signals $V_{out1}$ and $V_{out2}$ are complementary, one of either transistor T3' and T4' will be turned on while the other will be turned off, thereby concurrently turning on and off the first and second current mirrors.

When a current mirror is activated it will generate an output signal based upon the second logic side voltage VL2. For example, in one embodiment, an activated current mirror will generate a high output signal based upon the second logic side voltage VL2 equal to the supply voltage of the high-side, while in another embodiment an activated current mirror will generate a low output signal based upon the second logic side voltage VL2 equal to the ground voltage of the low-side. The output signal is stored in the latch 306 and drives the other output signal to a complementary value. For example, in a case where $V_{in1}$ is high, the first current mirror 302 is turned on and may drive the first output signal $V_{out1}$ to a high value, while the inverters of the latch 306 will drive the second output signal $V_{out2}$ to a complementary low value.

The output signals, stored in latch 306, are provided via buffers B1 and B2 to the gates of the control transistors T3' and T4'. Upon receiving a change in the state of the output voltages (e.g., receiving a high output voltage from a different active current mirror), the latch 306 will provide signals via buffers B1 and B2 to the gates of the control transistors T3' and T4', causing the control transistors to turn off the active current mirror.

Figure 4A:
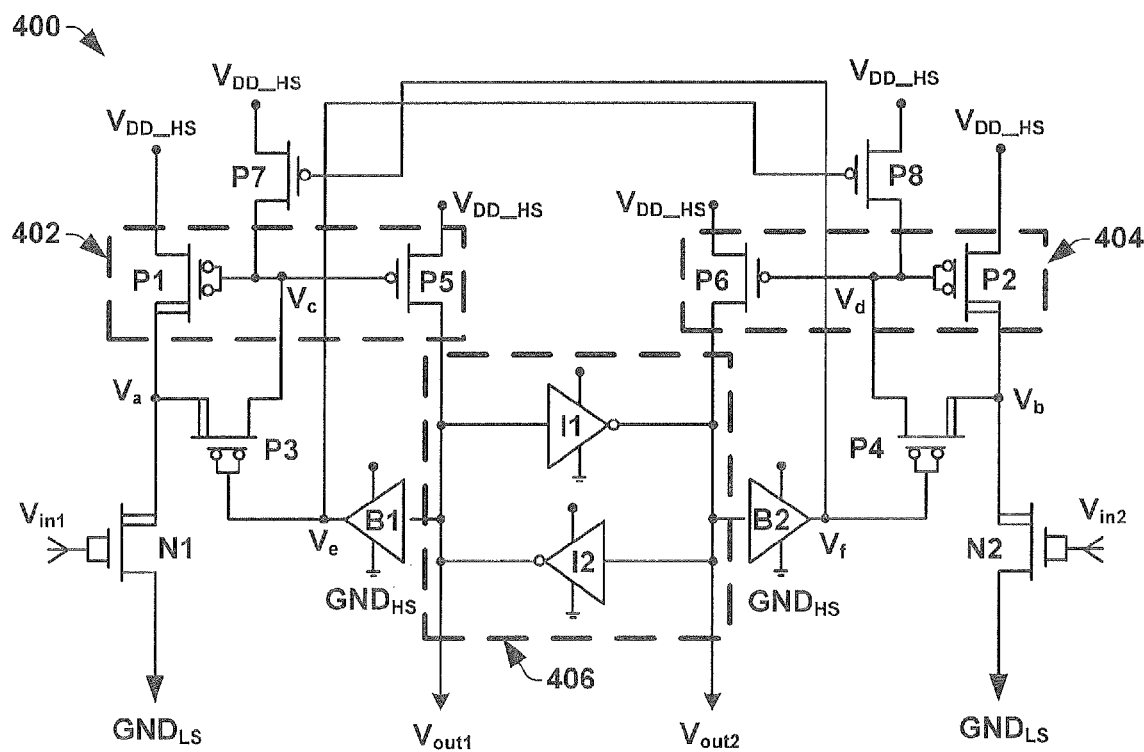
FIG. 4a illustrates a schematic diagram of an embodiment of a level shifter circuit configured to translate signals from low-side logic to high-side logic.

FIG. 4a illustrates a schematic diagram of a level shifter circuit 400 configured to translate signals from low-side logic to high-side logic.

As illustrated in FIG. 4a, the level shifter circuit comprises drain extended NMOS transistors (NDEMOS) N1 and N2 having gates configured to receive differential input signals $V_{in1}$ and $V_{in2}$ of a low-side logic (when one is high the other is low). In particular, the gate of NDEMOS transistor N1 is connected to a first low-side input signal $V_{in1}$ and the gate of NDEMOS transistor N2 is connected to a second low-side input signal $V_{in2}$, complementary to the first low-side input signal. The sources of transistors N1 and N2 are connected to the ground of the low-side logic $GND_{LS}$ (e.g., 0V) and the drains of transistors N1 and N2 are connected to first and second current mirrors, 402 and 404, respectively.

Transistors N1, N2, and P1-P4 are drain extended MOSFET's (DEMOS). DEMOS are used in the level shifter circuit 400 because DEMOS's are typically designed to handle relatively high drain to source or drain to gate voltages, which exceed the digital core supply voltage (e.g., having a drain to source voltage that is equal to the difference between the low side ground of 0V and the high side supply of Vbatt).

The first current mirror 402 comprises a p-type DEMOS transistor P1 and PMOS transistor P5. The gate of transistors P1 and P5 are connected and coupled to the drain of control transistors P3 and P7. Control transistor P3 is a drain extended PMOS transistor configured to activate (i.e., turn on) the first current mirror 402 by providing a low signal (e.g., by connecting the ground of the low-side logic) to the gates of transistors P1 and P5. Control transistor P7 is a PMOS transistor configured to deactivate (i.e., turn off) the first current mirror 402 by providing a high signal (e.g., by connecting the supply of the high-side logic) to the gates of transistors P1 and P5.

When the first current mirror 402 is turned on and transistor N1 is turned on, a current flows through a first branch of the current mirror, from the supply voltage of the high-side $V_{DD\_HS}$ to the ground of the low-side $GND_{LS}$. The current mirror 402 matches the current on the second branch of the current mirror (through transistor P5), driving the first output voltage $V_{out1}$ to a high value (e.g., to Vbatt).

The second current mirror 404 comprises a p-type DEMOS transistor P2 and PMOS transistor P6. The gate of transistors P2 and P6 are connected and coupled to the drain of transistors P4 and P8. Control transistor P4 is a drain extended PMOS transistor configured to activate (i.e., turn on) the second current mirror 404 by providing a low signal (i.e., by connecting the ground of the low-side logic) to the gates of transistors P2 and P6. Control transistor P8 is a PMOS transistor configured to deactivate (i.e., turn off) the second current mirror 404 by providing a high signal (i.e., by connecting the supply of the high-side logic) to the gates of transistors P2 and P6.

When the second current mirror 404 is turned on and transistor N2 is turned on, a current flows through a first branch of the current mirror, from the supply voltage of the high-side $V_{DD\_HS}$ to the ground of the low-side $GND_{LS}$. The current mirror 404 matches the current on the second branch of the current mirror (through transistor P6), driving the second output voltage $V_{out2}$ to a high value (e.g., to Vbatt).

The output of the first or second current mirrors are applied to a latch 406 comprising cross-coupled inverters I1 and I2. The latch 406 is configured to store the differential output signals $V_{out1}$ and $V_{out2}$. In particular, the latch 406 receives one differential output signal from an activated current mirror and then drives the complementary differential output signal to a complementary value. For example, if the $V_{out1}$ is set to a low value by the first current mirror 402 then $V_{out2}$ is set to a high value by the latch 406 since the input of the first inverter I1 will be low and the output from the first inverter I1 will be high. Because the high output of the first inverter I1 will be feed to the input of the second inverter I2, which will output a low signal, the cross-coupled inverters, I1 and I2, will hold the first output signal $V_{out1}$ to a low value and the second output signal $V_{out2}$ to a high value.

A first buffer B1 has an input coupled to the first differential output signal $V_{out1}$ and an output coupled to the gates of the control transistors P3 and P8. The first buffer B1 is configured to provide a signal to the gates of p-type transistors P3 and P8, which turns on one current mirror while turning off the other current mirror.

A second buffer B2 has an input coupled to the differential second output $V_{out2}$ and an output coupled to the gate of control transistors P4 and P8. The second buffer B2 is configured to provide a signal to the gates of p-type transistors P4 and P7, which turns on one current mirror while turning off the other current mirror.

For example, if $V_{out1}$ is low and $V_{out2}$ is high, buffer B1 will provide a low signal to the gates of control transistors P3 and P8 and buffer B2 will provide a high signal to the gates of control transistors P4 and P7. The low signal will turn off the second current mirror 404 by connecting the supply voltage of the high-side logic to the gates of p-type transistors P2 and P6. The low signal will also allow the first current mirror 402 to be turned on by an appropriate input signal, since it turns on transistor P3. Alternatively, if $V_{out1}$ is high and $V_{out2}$ is low, buffer B2 will provide a low signal to the gates of control transistors P4 and P7 and buffer B1 will provide a high signal to the gates of control transistors P3 and P8. The low signal will turn off the first current mirror 402 by connecting the supply voltage of the high-side logic to the gates of p-type transistors P1 and P5. The low signal will also allow the second current mirror 404 to be turned on by an appropriate input signal, since it turns on transistor P4.

Figure 4B:
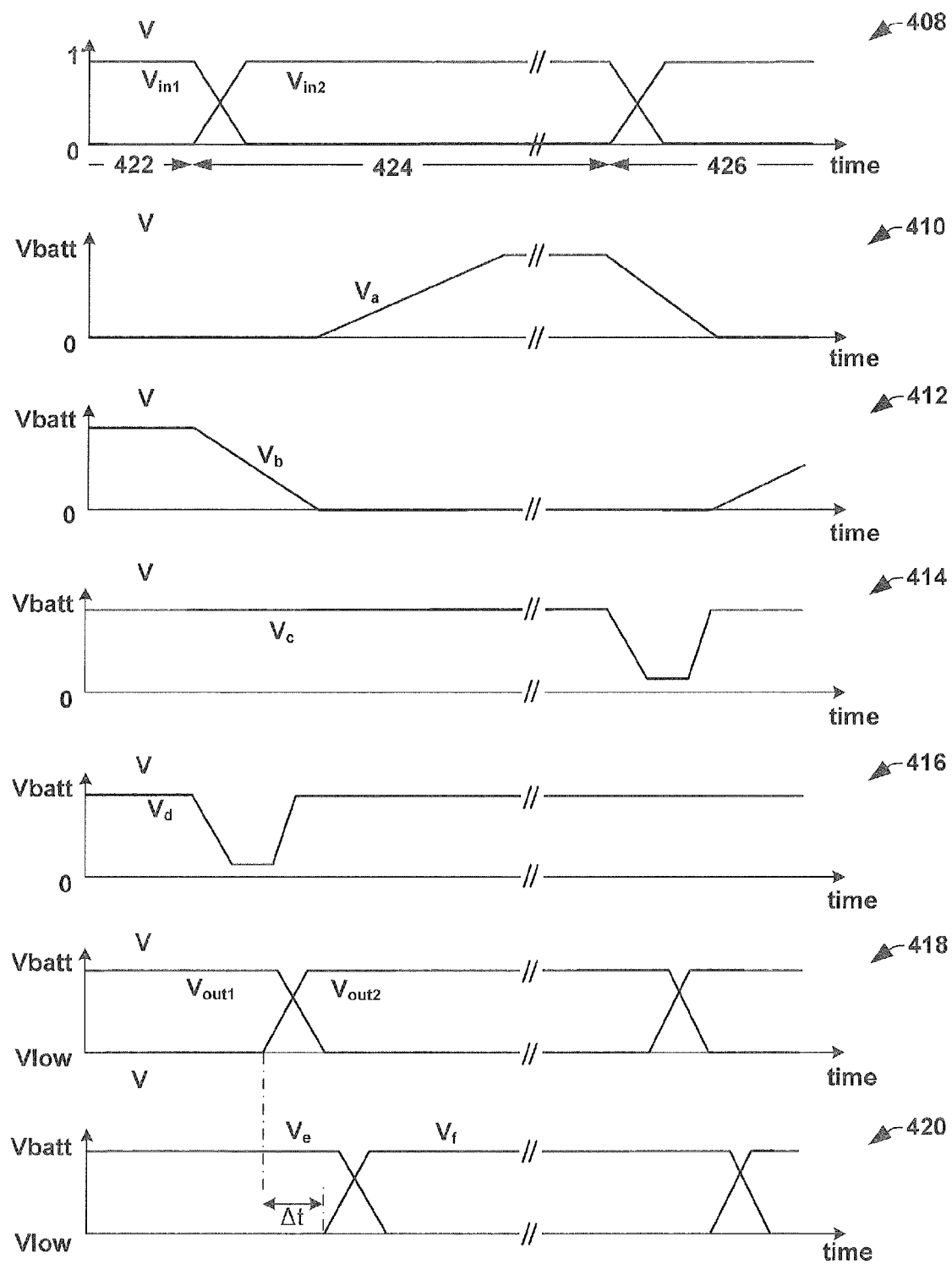

FIG. 4b illustrates signal diagrams corresponding to the level shifter circuit 400 of FIG. 4a. The signal diagrams illustrate operation of the level shifter circuit 400 during three exemplary periods of input data 422, 424, and 426. It will be appreciated that the signal diagrams are non-limiting diagrams intended to aid the reader in understanding of level shifter circuit 400. For example, the times and voltages shown in FIG. 4b are only examples.

When the level shifter circuit 400 is switched on for the first time, the content of the latch 406 is not well defined (e.g., either differential output signal, $V_{out1}$ or $V_{out2}$, may be high or low). However, when input signals $V_{in1}$ and $V_{in2}$ are applied, the content of the latch 406 will be adjusted in accordance with the received input signals.

For example, initially latch 406 may be in state that provides a first output signal $V_{out1}$ that is low and a second output signal $V_{out2}$ that is high. Since $V_{out1}$ is low, transistor P3 is turned on and current mirror 404 is turned off. If the first input signal $V_{in1}$ is low and the second input signal $V_{in2}$ is high, transistor N1 is turned off and the output signals $V_{out1}$ and $V_{out2}$ remain the same since the latch 406 is already in an appropriate state. However, if the first input signal $V_{in1}$ is high and the second input signal $V_{in2}$ is low, then the signals of the level circuit are driven to values that correspond to those shown in the first period of input data 422 of FIG. 4b.

As illustrated in the first period of input data 422 of FIG. 4b, the first input signal $V_{in1}$ has a high value and the second input signal $V_{in2}$ has a low value (graph 408). The low value of the second input signal $V_{in2}$ turns off transistor N2. Since transistor P2 is off (from $V_{out2}$ being high in the initial latch state) and transistor N2 is off, the voltage at Vb remains high (graph 412). The high value of the first input signal $V_{in1}$ turns on transistor N1, connecting Va to ground (graph 410). Since transistor P1 is on (from $V_{out1}$ being low in the initial latch state), current flows from VDD_HS through transistors P1 and N1 to ground $GND_{LS}$. This current flows through the first current mirror 402, resulting in a large current through transistor P5 that changes the state of the latch 406 to have differential output signal $V_{out1}$ high and differential output signal $V_{out2}$ low (graph 420).

The change in the state of the latch causes the input of buffer B1 (Ve) to be driven high (graph 420) and input of buffer B2 (Vf) to be driven low (graph 420). When the input voltage of buffer B1 goes high, transistors P3 and P8 are turned off. When the input voltage of buffer B2 goes low, transistors P4 and P7 are turned on and current mirror 402 is switched off so that no more current flows through transistor N1. Since N2 is off, Vd remains high, keeping the second current mirror 404 is turned off Both of the current mirrors remain off, reducing static power consumption of the leveler circuit, until a change in the differential input signal at a second period of input data 424.

During the second period of input data 424, the first input signal $V_{in1}$ changes from a high value to a low value and complementary second input signal $V_{in2}$ changes from a low value to a high value (graph 408).

The change of the input signal values turns off transistor N1 and turns on transistor N2. Transistor N2 connects Vb to ground, turning on current mirror 404. Since transistor P1 is on (from $V_{out2}$ being low in the first period of input data 422), current flows from VDD_HS through transistors P2 and N2 to ground $GND_{LS}$, resulting in a large current through transistor P6 that drives latch 406 to a state where $V_{out1}$ it is low and $V_{out2}$ is high (graph 420). The change in the state of the latch causes the input of buffer B1 (Ve) to be driven low and the input of buffer B2 (Vf) to be driven high.

When the input of buffer B1 is low, transistors P3 and P8 are turned on since the gate voltages are low, but no current flows through the first current mirror since transistor N1 is turned off (since $V_{in1}$ is low). When the input of buffer B2 is high, transistors P4 and P7 are turned off since the gate voltages are high, and no current flows through the second current mirror 404. Both of the current mirrors remain off, reducing static power consumption of the leveler circuit, until a change in the differential input signal at a third period of input data 426.

During a third period of input data 426, the first input $V_{in1}$ goes back to a high value and the second input $V_{in2}$ goes back to a low value. The low value of the second input signal $V_{in2}$ turns off transistor N2, but nothing changes because transistor P2 is off. The high value of $V_{in1}$ turns on transistor N1. Since transistor P1 is on (from $V_{out1}$ being low in the initial latch state), current flows from VDD_HS through transistors P1 and N1 to ground $GND_{LS}$. This current flows through the first current mirror 402, resulting in a large current through P5 changes the state of the latch 406.

The change in the state of the latch 406 causes the input of buffer B1 (Ve) to be driven high (graph 420) and input of buffer B2 (Vf) to be driven low. When the input of buffer B1 goes high, transistors P3 and P8 are turned off. When the input of buffer B2 goes low, transistors P4 and P7 are turned on and current mirror 402 is turned off so that no more current flows through transistor N1. Current mirror 404 is turned on, but since transistor N2 is already turned off no current flows.

Figure 5:
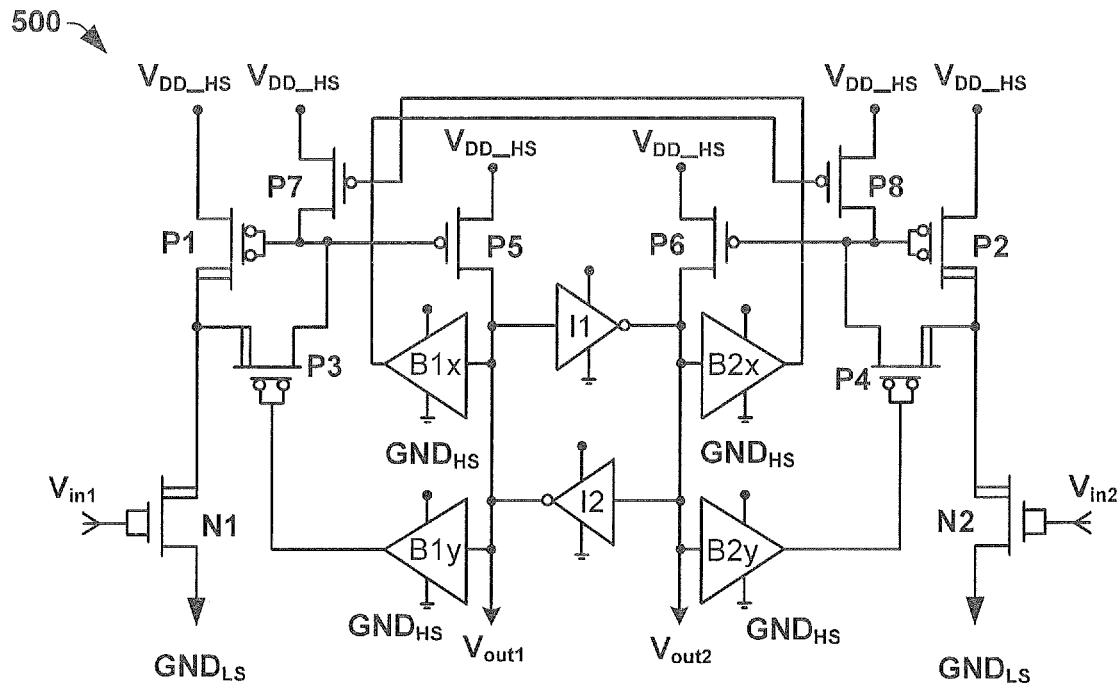
FIG. 5 illustrates a schematic diagram of an alternative embodiment of a level shifter circuit configured to translate signals from low-side logic to high-side logic.

FIG. 5 illustrates an alternative embodiment of a level shifter circuit configured to translate signals from low-side logic to high-side logic.

Level shifter circuit 500 generally comprises the same architecture as the level shifter circuit of FIG. 4a, expect that separate buffers are used to provide a signal to the gates of control transistors P3, P4, P7 and P8.

The use of separate buffers to provide a signal to each control transistor increases the speed of the level shifter circuit 500 by allowing the delay associated with each buffer to be specifically chosen. For example, each of the separate buffers, B1y, B1x, B2y, and B2x may have different, unequal delays, which are chosen to optimize operation of the level shifter circuit 500.

As illustrated in FIG. 5, buffer B1y has an input coupled to the first differential output $V_{out1}$ and an output coupled to the gate of control transistor P3. Buffer B1y is configured to provide a control signal to the gate of control transistor P3, which turns on the first current mirror. Buffer B1x has an input coupled to the first differential output $V_{out1}$ and an output coupled to the gate of control transistor P8. Buffer B1x is configured provide a control signal to the gate of control transistor P8, which turns off the second current mirror.

Similarly, buffer B2y has an input coupled to the second differential output $V_{out1}$ and an output coupled to the gate of control transistor P3. Buffer B2y is configured to provide a control signal to the gate of control transistor P3 that turns on the second current mirror. Buffer B2x has an input coupled to the second differential output $V_{out1}$ and an output coupled to the gate of control transistor P7. Buffer B2x is configured provide a control signal to the gate of control transistor P7 that turns off the first current mirror.

Figure 6:
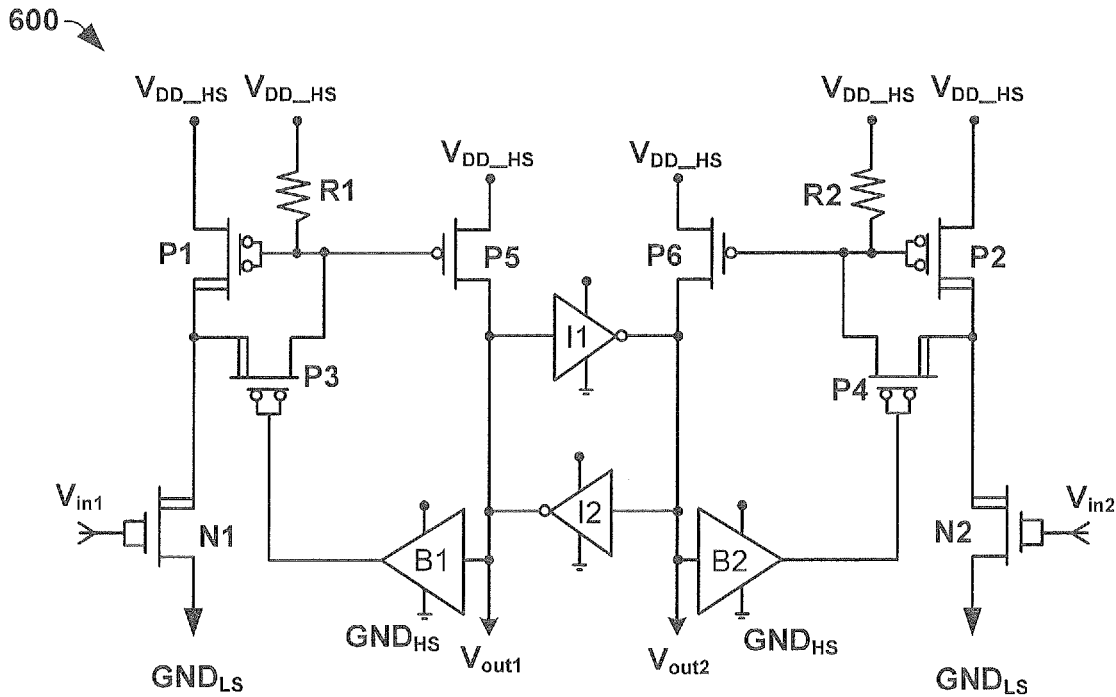
FIG. 6 illustrates a schematic diagram of another alternative embodiment of a level shifter circuit configured to translate signals from low-side logic to high-side logic.

FIG. 6 illustrates a schematic diagram of another alternative embodiment of a level shifter circuit 600 configured to translate signals from low-side logic to high-side logic.

In level shifter circuit 600, resistors R1 and R2 are disposed between the gates of the current mirror transistors and the supply voltage of the high side. For example, a first resistor R1 is disposed between the gates of transistors P1 and P5 of the first current mirror and the supply voltage of the high side $V_{DD\_HS}$, and a second resistor R2 is disposed between the gates of transistors P2 and P6 of the second current mirror and the supply voltage of the high side $V_{DD\_HS}$.

In such an embodiment, the resistors operate as switches that are on, but do not effect operation of the circuit. For example in a first period of input data, when Vout1 is high and Vout2 is low, the first current mirror may be turned off and the second current mirror may be turned on. When the first current mirror is turned off and transistor P3 is turned off and no current flows on the left side of the circuit. When the second current mirror is turned on and transistors P4 and P6 are on, transistor N2 is turned off and no current flows. In a second period of input data, when Vin1 and Vin2 are changed, transistor N2 turns off and transistor N1 is turned on and current flows through transistors P1 and P3 and R1. The current through transistor P1 is mirrored to transistor P5 and changes the state of the latch and the current through resistor R1 does not effect operation.

It will be appreciated that the methods and apparatus disclosed herein may be applied to a level shifter circuit configured to translate signals from a low side logic to a high side logic (e.g., as illustrated in FIGS. 4a and 5) or level shifter circuit configured to translate signals form a high side logic to a low side logic. To provide a level shifter configured to translate signals form a high side logic to a low side logic swaps the transistors types (e.g., p-type, n-type) illustrated in FIGS. 4a and 5.

Figure 7:
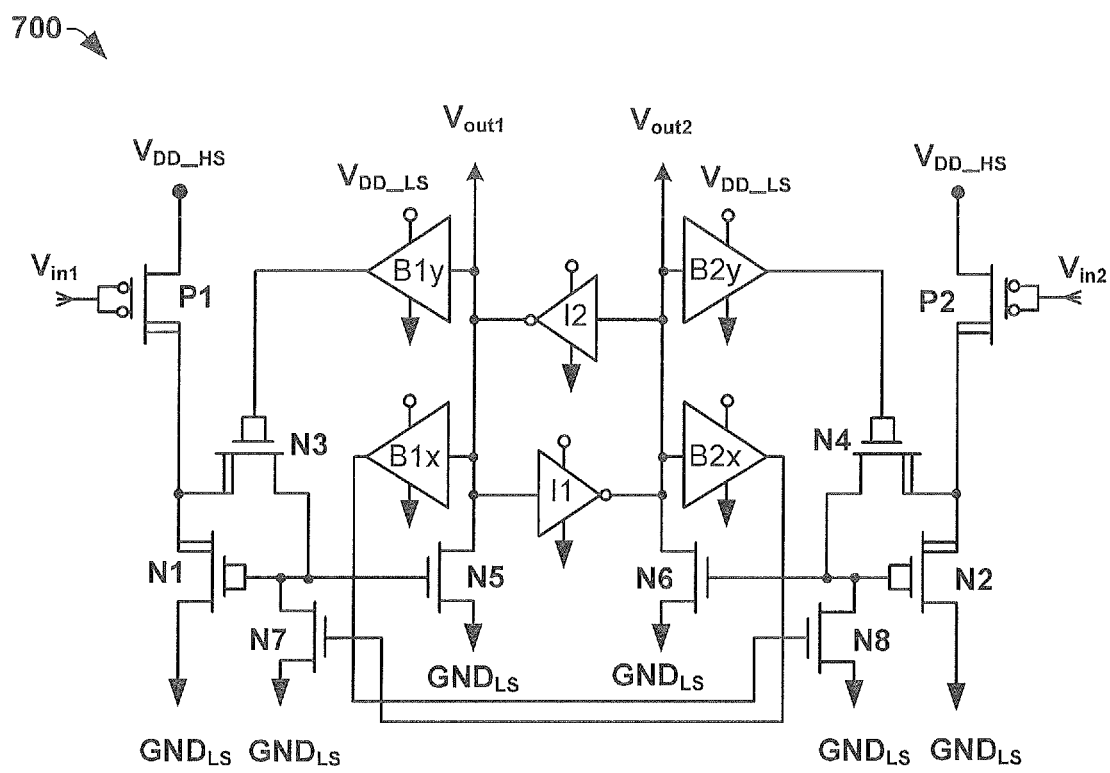
FIG. 7 illustrates a schematic diagram of an embodiment of a level shifter circuit configured to translate signals from high-side logic to low-side logic.

For example, FIG. 7 illustrates a first embodiment of a level shifter circuit 700 configured to translate signals form a high-side logic to a low-side logic.

As illustrated in FIG. 7, the level shifter circuit 700 comprises drain extended PMOS transistors (PDEMOS) P1 and P2 having gates configured to receive differential high-side input signals $V_{in1}$ and $V_{in2}$. The sources of transistors P1 and P2 are connected to the supply voltage of the high-side logic and the drains of transistors P1 and P2 are connected to first and second current mirrors, respectively.

The first current mirror comprises NDEMOS transistor N1 and NMOS transistor N5. A drain extended control transistor N3 is configured to turn on the first current mirror by providing a high signal (i.e., by connecting the gates of transistors N1 and N5 to the supply of the high-side logic) to the gates of transistors N1 and N5. Control transistor N7 is configured to turn off the first current mirror by providing a low signal (i.e., by connecting the gates of transistors N1 and N5 to the ground of the low-side logic) to the gates of transistors N1 and N5.

A second current mirror comprises NDEMOS transistor N2 and NMOS transistor N6. A drain extended control transistor N4 is configured to turn on the second current mirror by providing a high signal (i.e., by connecting the gates of transistors N2 and N6 to the supply of the high-side logic) to the gates of transistors N2 and N6. Control transistor N8 is configured to turn off the second current mirror by providing a low signal (i.e., by connecting the gates of transistors N2 and N6 to the ground of the low-side logic) to the gates of transistors N2 and N6.

The output of the first and second current mirrors are applied to a latch comprising cross-coupled inverters I1 and I2, which is configured to store differential output signals $V_{out1}$ and $V_{out2}$ generated by the first or second current mirrors.

Buffers B1x and B1y have inputs coupled to the first output $V_{out1}$ and outputs coupled to the gate of the control transistor N8 and the gate of the control transistor N3, respectively. Buffers B2x and B2y have inputs coupled to the second output $V_{out2}$ and outputs coupled to the gate of the control transistor N7 and the gate of the control transistor N4, respectively.

Figure 8:
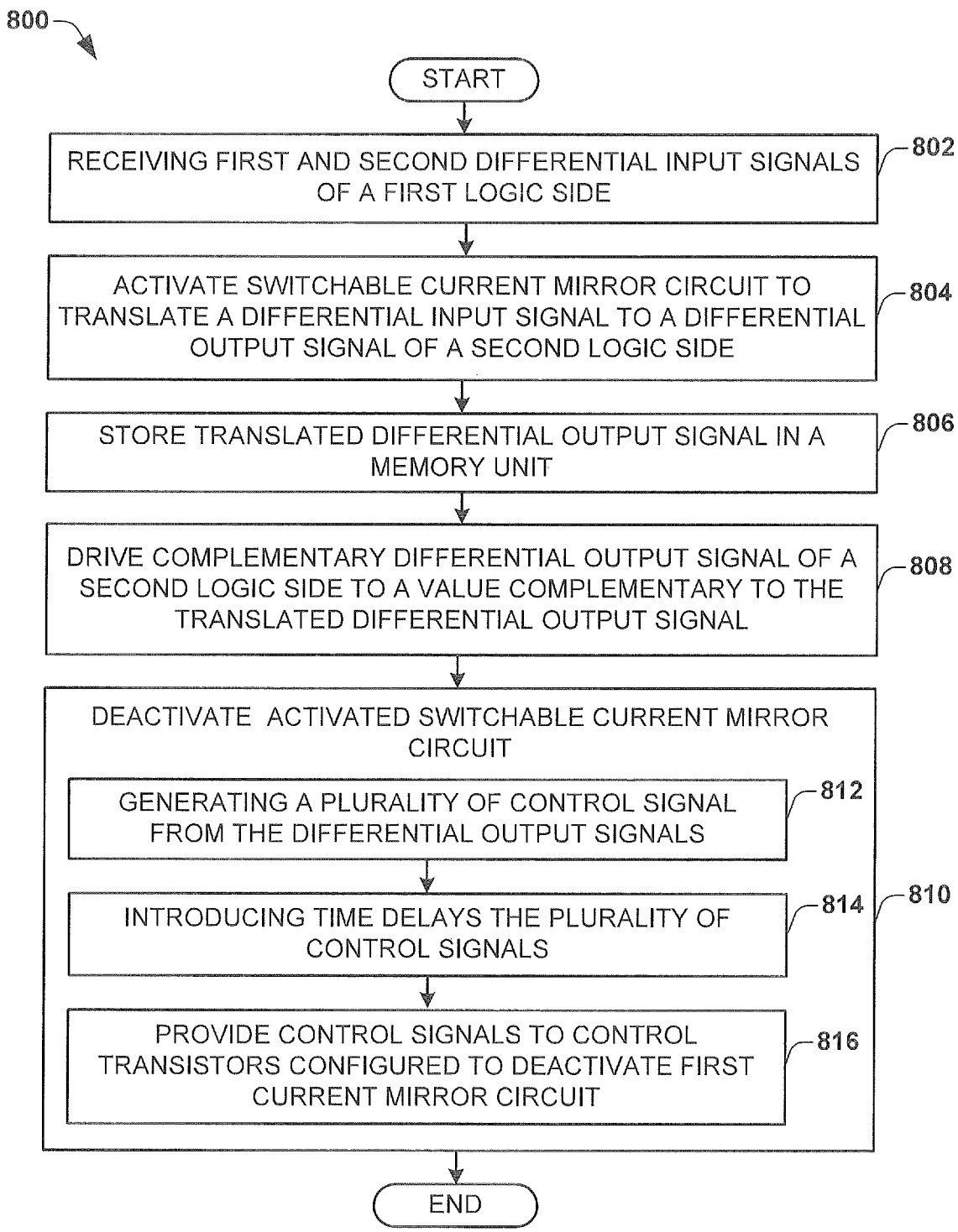
FIG. 8 illustrates a flow diagram of a more detailed exemplary method for translating signals from one logic side to another.

FIG. 8 is a flow diagram of a more detailed exemplary method for translating signals from one logic side to another logic side.

While methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuits shown in FIGS. 2, 3, etc., are non-limiting examples of circuits that may be used to implement method 800). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

At 802 first and second differential input signals of a first logic side are received. The first and second differential input signals comprise complementary input signals (e.g., a first high input signal and a second low input signal). In one embodiment, wherein the method translates a signal from a low-side logic to a high side logic, the first logic side may comprise a low-side logic. In another embodiment, wherein the method translates a signal from a high-side logic to a low side logic, the first logic side may comprise a high-side logic.

At 804 a switchable current mirror circuit is activated to translate a differential input signal to a differential output signal of a second logic side. The switchable current mirror circuit may comprise a first switchable current mirror circuit activated to translate a first differential input signal to first differential output signal or a second switchable current mirror circuit activated to translate a second differential input signal to second differential output signal. For example, in one embodiment, a first switchable current mirror may translate a low-side input signal of "1" to a high-side output signal of Vbatt.

At 806 a memory unit stores the translated differential output signal. In one embodiment, the memory unit comprises a latch having two cross-coupled inverters configured between the differential output signals such that the input of the one inverter is the first differential output signal and the input of the other inverter is the second complementary differential output signal.

At 808 a complementary differential output signal of the second logic side is driven to a value complementary to the translated differential output signal. Therefore, the complementary differential output signal and the translated differential output signal comprise first and second differential output signals of the second logic side that are output generated from the first and second differential input signals of the first logic side. In an embodiment wherein the memory unit comprises a latch, the second differential output signal is automatically driven to a complementary value of the first differential output signal by operation of the inverters.

At 810 the activated current mirror circuit is deactivated. In one embodiment the activated current mirror circuit is deactivated by generating a plurality of control signal from the differential output signals (step 812). Time delays are then introduced into the plurality of control signals (step 814). In one embodiment, a different time delay is introduced into each of the plurality of control signals. Control signals are then provided to control transistors configured to deactivate first current mirror circuit (step 816).

It will be appreciated that method 800 may be iteratively executed by a level shifter circuit, wherein between iterations the current mirror circuit is deactivated thereby allowing for a reduction in the static power consumption of the level shifter.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A level shifter, comprising:
a plurality of switchable current mirror circuits, respectively comprising a first transistor of a first type having a first gate connected to a second gate of a second transistor of the first type, and configured to be selectively activated to translate received differential input signals of a first logic side to complementary differential output signals of a second logic side;
a latch, configured to store the differential output signals, comprising a plurality of inputs respectively coupled to one of the plurality of switchable current mirrors; and
one or more switching elements configured to receive one or more of the stored differential output signals from the latch and to selectively deactivate an activated switchable current mirror circuit depending on values of the one or more received differential output signals.

2. The level shifter of claim 1, wherein the switchable current mirrors comprise:
a first switchable current mirror circuit configured to be selectively activated to translate a first differential input signal of the first logic side to a first differential output signal of the second logic side; and a second switchable current mirror circuit configured to be selectively activated to translate a second differential input signal of the first logic side to a second differential output signal of the second logic side, which is complementary to the first differential output signal.

3. The level shifter of claim 2, wherein the first and second switchable current mirror circuits are activated and deactivated in a complementary manner such that one of the first or second switchable current mirror is activated at a time to generate one of the differential output signals; and wherein the latch is further configured to drive the other differential output signal to a value complementary to the one of the differential output signals.

4. The level shifter of claim 3, wherein the first and second switchable current mirror circuits, respectively comprise:

a first PMOS transistor having a gate coupled to a gate of a first drain extended PMOS transistor;

wherein at least one of the one or more switching elements are connected to the gate of the first PMOS transistor.

5. The level shifter of claim 4, wherein the one or more switching elements, comprise:

a first drain extended PMOS control transistor, comprising:
a gate connected to the first differential output signal;
a drain connected to a supply voltage of the second logic side; and
a source connected to the gate of the first PMOS transistor in the first current mirror circuit;

a second drain extended PMOS control transistor, comprising:
a gate connected to the second differential output signal;
a drain connected to the supply voltage of the second logic side; and
a source connected to the gate of the first PMOS transistor in the second current mirror circuit.

6. The level shifter of claim 5, further comprising:

a first buffer located between the first differential output signal and the gate of the first drain extended PMOS control transistor; and a second buffer located between the second differential output signal and the gate of the second drain extended PMOS control transistor.

7. The level shifter of claim 1, wherein the first logic side comprises a low-side logic having a first voltage potential domain and wherein the first logic side comprises a high-side logic having a second voltage potential domain greater than the first voltage potential domain.

8. The level shifter of claim 1, wherein the latch comprises first and second cross-coupled inverters connected between differential outputs of the second logic side.

9. The level shifter of claim 1, wherein the one or more switching elements comprise a control transistor having a gate connected to an input of the latch and a drain connected to the first gate and the second gate.

10. A level shifter circuit, comprising:

a first transistor having a channel with a first doping type, comprising a gate connected to a first differential input signal of a first logic side, a source coupled to a first logic side voltage, and a drain coupled to a first switchable current mirror;

a second transistor having a channel with the first doping type, comprising a gate connected to a second differential input signal of the first logic side, a source coupled to the first logic side voltage, and a drain coupled to a switchable second current mirror;

wherein the first switchable current mirror comprises third and fourth transistors having channels with a second doping type, wherein gates of the third and fourth transistors are connected, wherein the drain of the third transistor is coupled to the source of the first transistor, and wherein the drain of the fourth transistor is connected to a first differential output terminal of a second logic side;

wherein the second switchable current mirror comprises fifth and sixth transistors having channels with the second doping type, wherein gates of the fifth and sixth transistors are connected, wherein the drain of the fifth transistor is coupled to the source of the second transistor, and wherein the drain of the sixth transistor is connected to a second differential output terminal of the second logic side;

a latch connected between the differential output terminals and configured to store a first differential output signal generated by one of the first or second switchable current mirrors and to generate a second differential output signal therefrom; and a plurality of control transistors configured to activate and deactivate the first or second switchable current mirrors.

11. The level shifter circuit of claim 10, wherein the plurality of control transistors are configured to activated and deactivated the first and second switchable current mirrors in a complementary manner such that one of the first or second switchable current mirror is activated at a time to generate one of the differential output signals.

12. The level shifter circuit of claim 10, wherein the plurality of control transistors comprise:

a first control transistor configured to activate the first switchable current mirror based upon a value of the first or second differential outputs; and a second control transistor configured to activate the second switchable current mirror based upon the value of the first or second differential outputs.

13. The level shifter circuit of claim 12, wherein the first control transistor comprises a drain extended transistor having a source connected to the drain of the first transistor; and wherein the second control transistor comprises a drain extended transistor having a source connected to the drain of the second transistor.

14. The level circuit of claim 12, further comprising:

a first buffer comprising an input coupled to the first differential output and having an output coupled to a gate of the first control transistor; and a second buffer comprising an input coupled to the second differential output and having an output coupled to a gate of the second control transistor.

15. The level circuit of claim 12, further comprising:

a first resistor coupled between a voltage of the second logic side and the gates of the third and fourth transistors; and a second resistor coupled between the voltage of the second logic side and the gates of the fifth and sixth transistors.

16. The level shifter circuit of claim 15, a third control transistor configured to deactivate first switchable current mirror based upon the value of the first or second differential outputs; and a fourth control transistor configured to deactivate the switchable second current mirror based upon the value of the first or second differential outputs;

wherein the third control transistor comprises a PMOS transistor having a source connected to a supply voltage of the high-side logic and a drain connected to the gates of the third and fourth transistors;

wherein the fourth control transistor comprises a PMOS transistor having a source connected to the supply of the of the high-side logic and a drain connected to the gates of the fifth and sixth transistors.

17. The level circuit of claim 16, further comprising:

a first buffer having an input coupled to the first differential output terminal and having an output coupled to a gate of the first control transistor;

a second buffer having an input coupled to the second differential output terminal and having an output coupled to the gate of the second control transistor;

a third buffer having an input coupled to the first differential output terminal and having an output coupled to the gate of the third control transistor; and a fourth buffer having an input coupled to the second differential output terminal and having an output coupled to the gate of the fourth control transistor.

18. A method for translating signals from one logic side to another, comprising:

receiving first and second differential input signals of a first logic side;

activating a first switchable current mirror circuit, comprising a first transistor of a first type having a first gate connected to a second gate of a second transistor of the first type, to translate the first differential input signal to a first differential output signal of a second logic side;

storing the first differential output signal of the second logic side in a memory unit;

driving a second differential output signal of a second logic side to a value complementary to the first differential output signal; and selectively deactivating the first switchable current mirror circuit based upon the values of the first and second differential output signals.

19. The method of claim 18, further comprising:

deactivating a second switchable current mirror, comprising a third transistor of the first type having a third gate connected to a fourth gate of a fourth transistor of the first type, while the first switchable current mirror is activated.

20. The method of claim 18, wherein the first and the second differential output signals have complementary values.

21. The method of claim 18, wherein the first logic side comprises a low-side logic having a first voltage potential domain and wherein the first logic side comprises a high-side logic having a second voltage potential domain greater than the first voltage potential domain.

22. The method of claim 18, further comprising:

operating a control transistor, having a gate connected to the memory unit and a drain connected to the first gate and the second gate, to selectively activate and deactivate the first switchable current mirror.

* * * * *